US011469744B1

(12) United States Patent
Chiu (10) Patent No.: US 11,469,744 B1
(45) Date of Patent: Oct. 11, 2022

(54) LEVEL SHIFTER

(71) Applicant: NOVATEK MICROELECTRONICS CORP., Hsinchu (TW)

(72) Inventor: Hsiang-Yi Chiu, Hsinchu (TW)

(73) Assignee: NOVATEK MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 17/493,006

(22) Filed: Oct. 4, 2021

(51) Int. Cl.
*H03L 5/00* (2006.01)
*H03K 3/037* (2006.01)
*H03K 19/0185* (2006.01)
*H03K 19/0948* (2006.01)
*H03K 3/356* (2006.01)

(52) U.S. Cl.
CPC . *H03K 3/356113* (2013.01); *H03K 3/356182* (2013.01); *H03K 19/018521* (2013.01)

(58) Field of Classification Search
None
See application file for complete search history.

(56) References Cited

U.S. PATENT DOCUMENTS 6,222,385 B1 * 4/2001 Kang ............. H03K 19/018585
326/63
6,717,453 B2 * 4/2004 Aoki ................ H03K 19/01728
327/333

* cited by examiner

*Primary Examiner* — Kenneth B Wells
(74) *Attorney, Agent, or Firm* — Rosenberg, Klein & Lee (57) ABSTRACT

A level shifter includes a pre-level shifter and a selector. The selector is coupled to the pre-level shifter. The pre-level shifter shifts an input digital voltage to a first digital voltage and a second digital voltage. The levels of the first digital voltage and the second digital voltage transition sequentially in time when the level of the input digital voltage transitions from one logic to the other. The selector selects and outputs the first digital voltage whose level transitions earlier in time compared to the transition of the level of the second digital voltage.

7 Claims, 6 Drawing Sheets

LEVEL SHIFTER

BACKGROUND OF THE INVENTION

Field of the Invention

The invention relates to driving technology, particularly to a level shifter that rapidly shifts and outputs a voltage level without increasing quiescent current.

Description of the Related Art

Circuits with diverse functions may be integrated in a single integrated circuit. The circuits may use different levels of power source voltages, which require an interface circuit that changes voltage levels of the signals transferred between the circuits. Such an interface circuit is called a level shifter.

Figure 1:
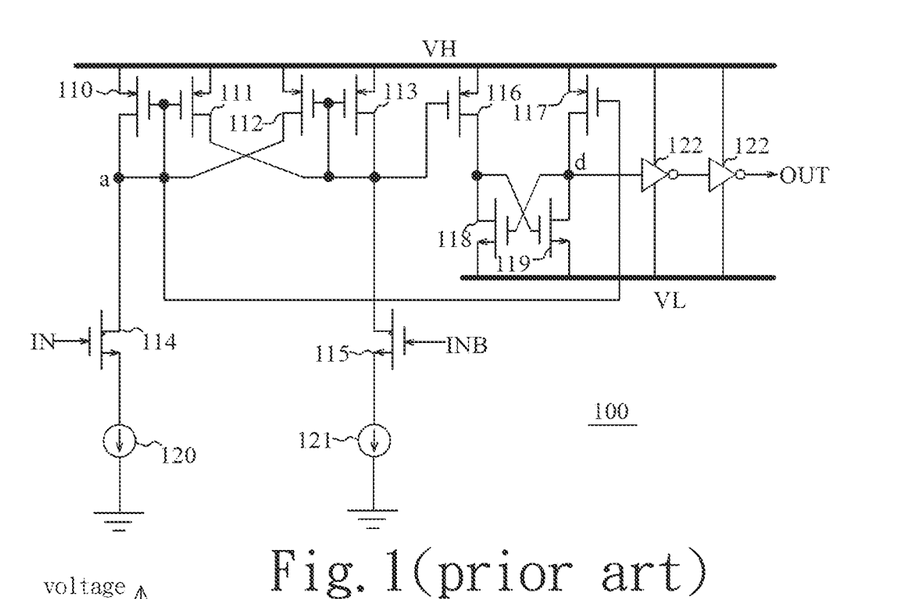
FIG. 1 is a diagram schematically illustrating a conventional level shifter.
Figure 2:
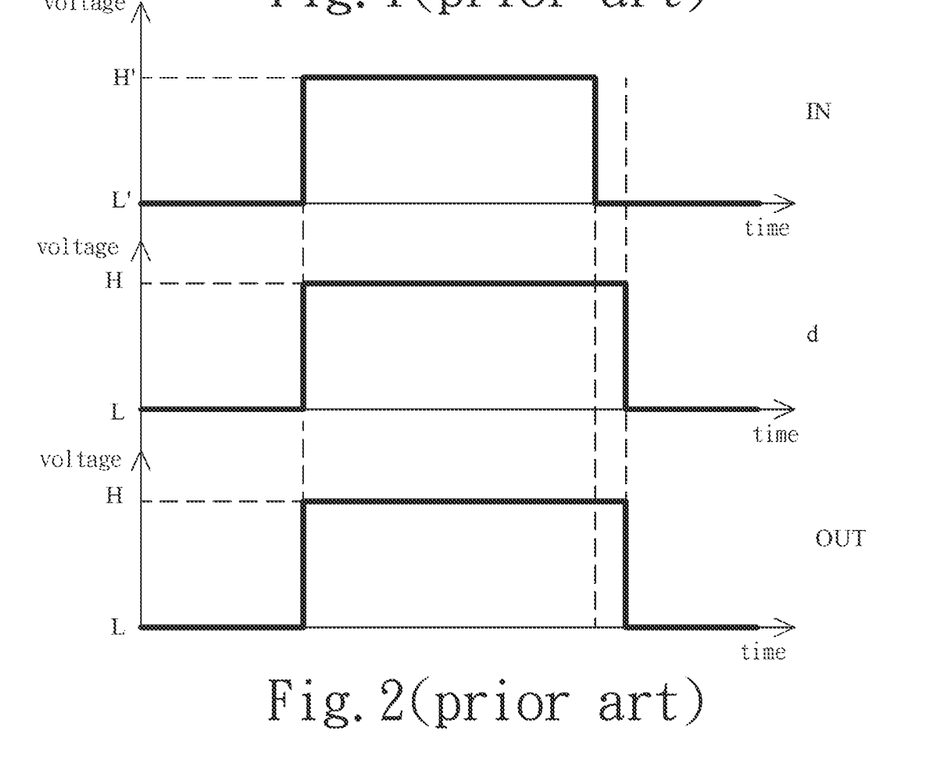
FIG. 2 is a diagram schematically illustrating the waveforms of an input voltage, the signal of an output node, and an output voltage of a conventional level shifter.

FIG. 1 is a diagram schematically illustrating a conventional level shifter. FIG. 2 is a diagram schematically illustrating the waveforms of an input voltage, the signal of an output node, and an output voltage of a conventional level shifter. Referring to FIG. 1 and FIG. 2, the level shifter 100 includes a first P-channel metal-oxide-semiconductor field effect transistor (PMOSFET) 110, a second P-channel metal-oxide-semiconductor field effect transistor (PMOSFET) 111, a third P-channel metal-oxide-semiconductor field effect transistor (PMOSFET) 112, a fourth P-channel metal-oxide-semiconductor field effect transistor (PMOSFET) 113, a first N-channel metal-oxide-semiconductor field effect transistor (NMOSFET) 114, a second N-channel metal-oxide-semiconductor field effect transistor (NMOSFET) 115, a fifth P-channel metal-oxide-semiconductor field effect transistor (PMOSFET) 116, a sixth P-channel metal-oxide-semiconductor field effect transistor (PMOSFET) 117, a third N-channel metal-oxide-semiconductor field effect transistor (NMOSFET) 118, a fourth N-channel metal-oxide-semiconductor field effect transistor (NMOSFET) 119, a first current source 120, a second current source 121, and two inverters 122. VH represents a logic high level H and VL represents a logic low level L. The first PMOSFET 110, the second PMOSFET 111, the third PMOSFET 112, and the fourth PMOSFET 113 operate slowly since the first PMOSFET 110, the second PMOSFET 111, the third PMOSFET 112, and the fourth PMOSFET 113 are connected to function like a latch. The first NMOSFET 114 and the second NMOSFET 115 respectively receive input voltages IN and INB. The input voltages IN and INB are inverted digital voltages. When the input voltage IN rises from a logic low level L' to a logic high level H', the voltage of node a is rapidly pulled to a low voltage. Thus, the sixth PMOSFET 117 is turned on to pull the voltage of node d to a logic high level H. Then, the inverters 122 can rapidly output the output voltage OUT at a logic high level H. When the input voltage IN descends from a logic high level H' to a logic low high level L', the first PMOSFET 110 and the third PMOSFET 112 slowly pull the voltage of node a to a high voltage. Thus, the voltage of node d is pulled to a logic low level L after a delay time. Then, the inverters 122 can slowly output the output voltage OUT at a logic low level L. In other words, the output voltage OUT needs a longer propagation delay to vary when the input voltage IN descends from a logic high level H' to a logic low high level L'. The ability to pull the voltage of node a to a high voltage depends on the current of the second current source 121 since the driving current of the third PMOSFET 112 is mirrored by the driving current of the fourth PMOSFET 113. In order to rapidly pull the voltage of node a to a high voltage, the current of the second current source 121 needs to be increased. However, the increased current of the second current source 121 will cause high quiescent current.

SUMMARY OF THE INVENTION

The invention provides a level shifter, which rapidly shifts and outputs a voltage level without increasing quiescent current.

In an embodiment of the invention, a level shifter includes a pre-level shifter and a selector. The selector is coupled to the pre-level shifter. The pre-level shifter shifts an input digital voltage to a first digital voltage and a second digital voltage. The levels of the first digital voltage and the second digital voltage transition sequentially in time when the level of the input digital voltage transitions form one logic to the other. The selector selects and outputs the first digital voltage whose level transitions earlier in time compared to the transition of the level of the second digital voltage.

To sum up, the level shifter automatically selects a fast signal-transmitting path in order to rapidly shift and output a voltage level without increasing quiescent current.

Below, the embodiments are described in detail in cooperation with the drawings to make easily understood the technical contents, characteristics and accomplishments of the invention.

DETAILED DESCRIPTION OF THE INVENTION

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express what the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Certain terms are used throughout the description and the claims to refer to particular components. One skilled in the art appreciates that a component may be referred to using different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to encompass any indirect or direct connection. Accordingly, if this disclosure mentions that a first device is coupled with a second device, it means that the first device may be directly or indirectly connected to the second device through electrical connections, wireless communications, optical communications, or other signal connections with without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the articles "a" and "the" includes the meaning of "one or at least one" of the elements or components. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. The examples in the present specification do not limit the claimed scope of the invention.

The terms "substantially," "around," "about" and "approximately" can refer to within 20% of a given value or range, and preferably within 10%. In addition, the quantities provided herein can be approximate ones and can be described with the aforementioned terms without being specified. When a quantity, density, or other parameter includes a specified range, preferable range or listed ideal values, their values can be viewed as any number within the given range. For example, if it is described that the length of a component is X cm to Y cm, this is equivalent to "the length of the component is H, and H can be any real number value between the values of X and Y."

In the following description, a level shifter will be described. The level shifter automatically selects a fast signal-transmitting path in order to rapidly shift and output a voltage level without increasing quiescent current. The level shifters described below may also be applied to other circuit configurations.

Figure 3:
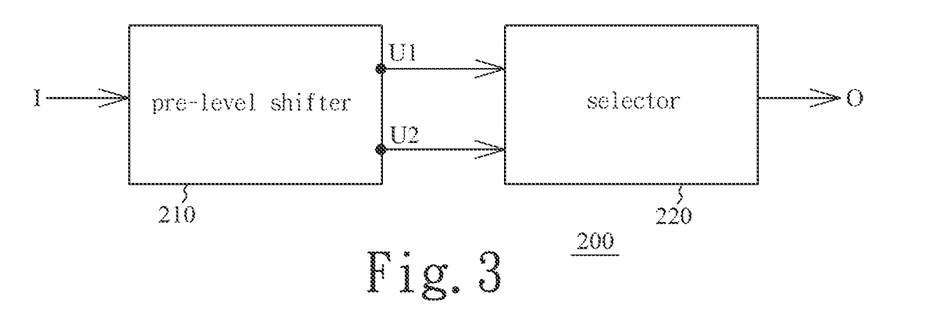
FIG. 3 is a diagram schematically illustrating a level shifter according to a first embodiment of the invention.
Figure 4:
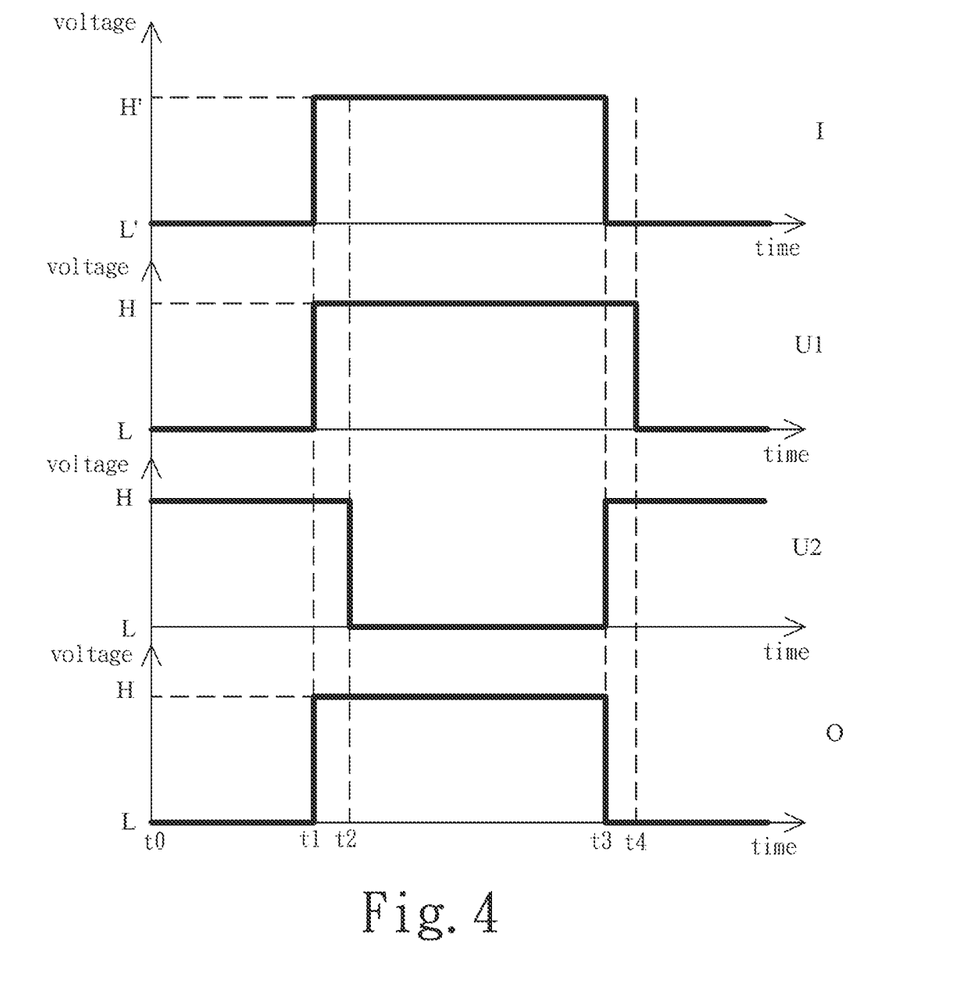
FIG. 4 is a diagram schematically illustrating the waveforms of an input digital voltage, a first digital voltage, a second digital voltage, and an output digital voltage of the level shifter according to the first embodiment of the invention.

FIG. 3 is a diagram schematically illustrating a level shifter according to a first embodiment of the invention. FIG. 4 is a diagram schematically illustrating the waveforms of an input digital voltage, a first digital voltage, a second digital voltage, and an output digital voltage of the level shifter according to the first embodiment of the invention. Referring to FIG. 3 and FIG. 4, the first embodiment of the invention is introduced as follows. In the first embodiment, a level shifter 200 includes a pre-level shifter 210 and a selector 220. The pre-level shifter 210 has an input and two outputs U1 and U2. The two outputs U1 and U2 of the pre-level shifter 210 are coupled to the selector 220.

The operation of the level shifter 200 of the first embodiment is introduced as follows. The pre-level shifter 210 receives an input digital voltage I and shifts the input digital voltage I to a first digital voltage and a second digital voltage. Thus, the two outputs U1 and U2 of the pre-level shifter 210 respectively output the first digital voltage and the second digital voltage. For example, the input digital voltage I has a range of 0-3 V and each of the first digital voltage and the second digital voltage has a range of 25-30 V, but the invention is not limited thereto. Specifically, the logic low level L' and the logic high level H' of the input digital voltage I are respectively 0 V and 3 V. The logic low level L and the logic high level H of each of the first digital voltage and the second digital voltage are respectively 25 V and 30 V. During a period between time point t0 and time point t1, the input digital voltage I is at logic low level L', the output U1 of the pre-level shifter 210 outputs the logic low level L as the first digital voltage, and the output U2 of the pre-level shifter 210 outputs the logic high level H as the second digital voltage. Limited by the circuit properties of the pre-level shifter 210, the levels of the first digital voltage and the second digital voltage transition sequentially in time when the level of the input digital voltage I transitions form one logic to the other. For example, the level of the first digital voltage rises from the logic low level L to the logic high level H at time point t1 and the level of the second digital voltage descends from the logic high level H to the logic low level L at time point t2 when the level of the input digital voltage I rises from the logic low level L' to the logic high level H' at time point t1. The selector 220 receives the first digital voltage and the second digital voltage and selects and outputs the first digital voltage whose level transitions earlier in time compared to the level of the second digital voltage since time point t1 is earlier in time than time point t2. Thus, the selector 220 outputs the first digital voltage as an output digital voltage O between time point t1 and time point t3. That is to say, the output digital voltage O is the logic high level H between time point t1 and time point t3.

During a period between time point t2 and time point t3, the input digital voltage I is the logic high level H', the output U1 of the pre-level shifter 210 outputs the logic high level H as the second digital voltage, and the output U2 of the pre-level shifter 210 outputs the logic low level L as the first digital voltage. Limited by the circuit properties of the pre-level shifter 210, the levels of the first digital voltage and the second digital voltage transition in time when the level of the input digital voltage I transitions from one logic level to the other. For example, the level of the first digital voltage rises from the logic low level L to the logic high level H at time point t3 and the level of the second digital voltage descends from the logic high level H to the logic low level L at time point t4 when the level of the input digital voltage I descends from the logic high level H' to the logic low level L' at time point t3. The selector 220 receives the first digital voltage and the second digital voltage. The selector 220 selects and outputs the first digital voltage whose level transitions earlier in time compared to the level of the second digital voltage without increasing quiescent current since time point t3 is early than time point t4. Thus, the selector 220 outputs the inverted first digital voltage as the output digital voltage O after time point t3 since the selector 220 may invert the first digital voltage. That is to say, the output digital voltage O is a logic low level L after time point t3. Alternatively, the selector 220 may directly output the first digital voltage as the output digital voltage O, such that the output digital voltage O is a logic high level H after time point t3.

Figure 5:
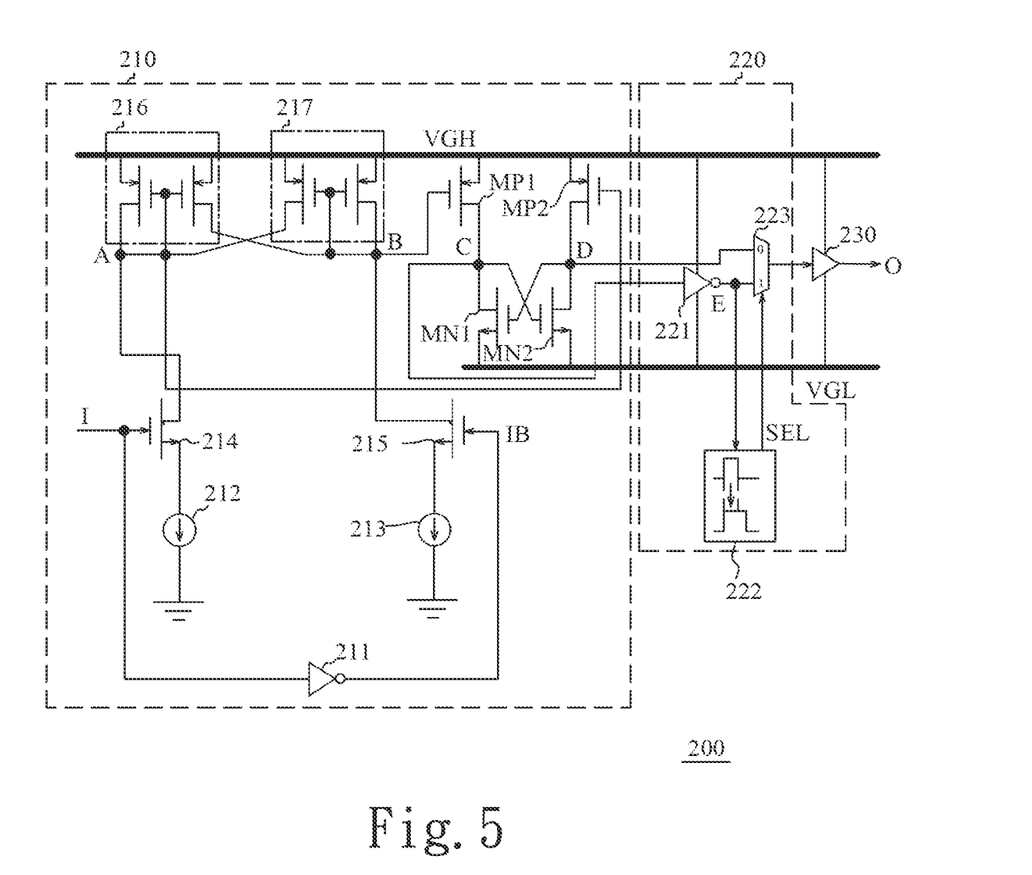
FIG. 5 is a diagram schematically illustrating a level shifter according to a second embodiment of the invention.
Figure 6:
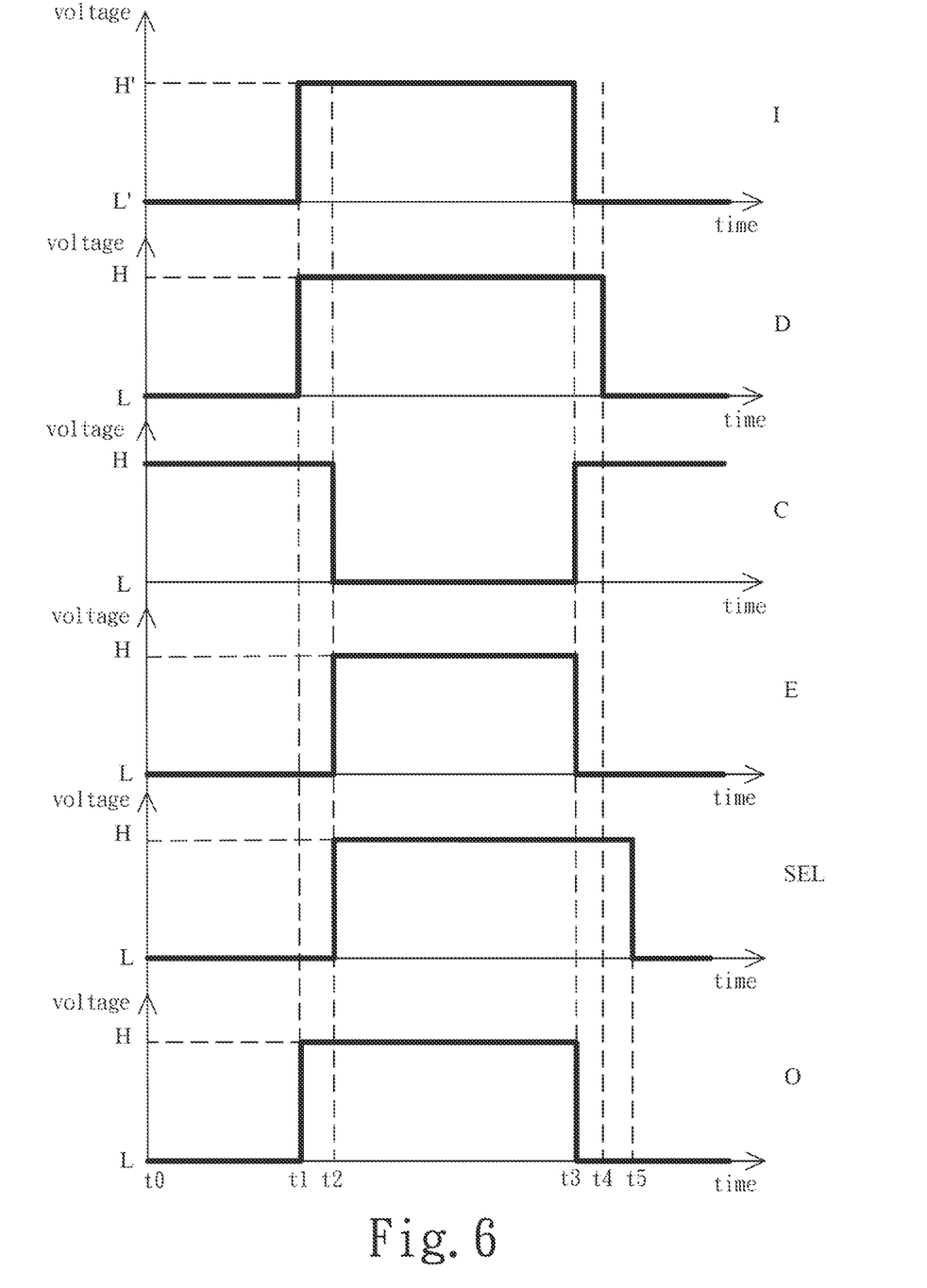
FIG. 6 is a diagram schematically illustrating the waveforms of an input digital voltage, signals of nodes, a settle voltage, and an output digital voltage of the level shifter according to the second embodiment of the invention.

FIG. 5 is a diagram schematically illustrating a level shifter according to a second embodiment of the invention. FIG. 6 is a diagram schematically illustrating the waveforms of an input digital voltage, signals of nodes, a settle voltage, and an output digital voltage of the level shifter according to the second embodiment of the invention. Referring to FIG. 5 and FIG. 6, the second embodiment of the invention is introduced as follows. The second embodiment is different from the first embodiment in the internal circuits of the pre-level shifter 210 and the selector 220. In the second embodiment, the pre-level shifter 210 may include, but is not limited to, a first inverter 211, a first current source 212, a second current source 213, a first electrical switch 214, a second electrical switch 215, a first current mirror 216, a second current mirror 217, a first P-channel metal-oxide-semiconductor field effect transistor (PMOSFET) MP1, a second P-channel metal-oxide-semiconductor field effect transistor (PMOSFET) MP2, a first N-channel metal-oxide-semiconductor field effect transistor (NMOSFET) MN1, and a second N-channel metal-oxide-semiconductor field effect transistor (NMOSFET) MN2. The first electrical switch 214 and the second electrical switch 215 are N-channel metal-oxide-semiconductor field effect transistors (NMOSFETs), but the invention is not limited thereto. The first current mirror 216 includes, but is not limited to, two P-channel metal-oxide-semiconductor field effect transistors (PMOSFETs). The second current mirror 217 includes, but is not limited to, two P-channel metal-oxide-semiconductor field effect transistors (PMOSFETs).

The first current source 212 and the second current source 213 are coupled to a first low-voltage terminal. The first low-voltage terminal may be a grounding terminal, but the invention is not limited thereto. The first electrical switch 214 and the second electrical switch 215 are respectively coupled to the first current source 212 and the second current source 213. The second electrical switch 215 is coupled to the inverter 211. The first current mirror 216 and the second current mirror 217 are coupled to a high-voltage terminal and respectively coupled to the first electrical switch 214 and the second electrical switch 215. The voltage of the high-voltage terminal is represented by VGH. VGH represents a logic high level H. The first current mirror 216 is coupled to the second current mirror 217. The voltage levels of nodes A and B do not transition easily since the first current mirror 216 and the second current mirror 217 are connected to function like a latch. In order to easily transition the voltage levels of nodes A and B, the driving abilities of transistors of the first electrical switch 214 and the second electrical switch 215 are higher than those of the first current mirror 216 and the second current mirror 217. That is to say, the channel length and the channel width of the transistors of the first electrical switch 214 and the second electrical switch 215 are greater than those of the first current mirror 216 and the second current mirror 217.

The first PMOSFET MP1 is coupled to the high-voltage terminal, the second electrical switch 215, the second current mirror 217, and the selector 220. The second PMOSFET MP2 is coupled to the high-voltage terminal, the first electrical switch 214, the first current mirror 216, and the selector 220. The first NMOSFET MN1 is coupled to a second low-voltage terminal, the first PMOSFET MP1, the selector 220, and the second PMOSFET MP2. The voltage of the second low-voltage terminal is represented by VGL. VGL represents a logic low level L. In some embodiments, the voltage of the first low-voltage terminal may be substantially lower than the voltage of the second low-voltage terminal. The second NMOSFET MN2 is coupled to the second low-voltage terminal, the second PMOSFET MP2, the selector 220, the first NMOSFET MN1, and the first PMOSFET MP1. The voltage levels of nodes C and D do not transition easily since the first NMOSFET MN1 and the second NMOSFET MN2 are connected to function like a latch. In order to easily transition the voltage levels of nodes C and D, the driving abilities of the first PMOSFET MP1 and the second PMOSFET MP2 are higher than those of the first NMOSFET MN1 and the second NMOSFET MN2. That is to say, the channel length and the channel width of transistors the first PMOSFET MP1 and the second PMOSFET MP2 are greater than those of the first NMOSFET MN1 and the second NMOSFET MN2. Node C is located between the first NMOSFET MN1 and the first PMOSFET MP1 and viewed as an output of the pre-level shifter 210, and node D is located between the second NMOSFET MN2 and the second PMOSFET MP2 and viewed as another output of the pre-level shifter 210

In the second embodiment, the selector 220 may include, but is not limited to, a second inverter 221, a falling-edge delay cell 222, and a multiplexer 223. The input of the second inverter 221 is coupled to node C of the pre-level shifter 210. The falling-edge delay cell 222 is coupled to the output of the second inverter 221. The output of the second inverter 221 is viewed as node E. The multiplexer 223 is coupled to the falling-edge delay cell 222, the output of the second inverter 221, and node D of the pre-level shifter. In order to improve the driving ability, the level shifter 200 may further include a buffer 230 coupled to the multiplexer 223 of the selector 220. The buffer 230 may be coupled to the high-voltage terminal and the second low-voltage terminal. Alternatively, the buffer 230 may be coupled to external power. In some embodiments of the invention, the buffer 230 may include two inverters coupled in series, but the invention is not limited thereto.

The operation of the level shifter 200 of the second embodiment is introduced as follows. During a period between time point t0 and time point t1, the first electrical switch 214 and the first inverter 211 receive a logic low level L' as the input digital voltage I. Then, the input digital voltage I turns off the first electrical switch 214. The first inverter 211 inverts the input digital voltage I to generate a logic high level H' as an input digital voltage IB. The input digital voltage IB turns on the second electrical switch 215. Thus, the current of the second current source 213 flows through the second electrical switch 215, so as to pull the voltage of node B to a low voltage. The voltage of node B turns on the first PMOSFET MP1 to pull the voltage of node C to a logic high level H. The voltage of node C turns on the second NMOSFET MN2 to pull the voltage of node D to a logic low level L. The voltages of node C and D are respectively viewed as the second digital voltage and the first digital voltage. The second inverter 221 inverts the voltage of node C to generate a logic low level L at node E. The falling-edge delay cell 222 receives the voltage of node E to generate a logic low level L as a settle voltage SEL. The multiplexer 223 receives the voltages of nodes D and E and the settle voltage SEL. The multiplexer 223 selects and outputs the voltage of node D according to a logic low level L as the settle voltage SEL. Finally, the buffer 230 receives the voltage of node D to output a logic low level L as the output digital voltage O.

When the level of the input digital voltage I rises from the logic low level L' to the logic high level H' at time point t1, the level of the input digital voltage IB descends from the logic high level H' to the logic low level L' at time point t1. The input digital voltage I turns on the first electrical switch 214. The input digital voltage IB turns off the second electrical switch 215. The current of the first current source 212 flows through the first electrical switch 214, so as to pull the voltage of node A to a low voltage. The voltage of node A turns on the second PMOSFET MP2 to pull the voltage of node D to a logic high level H. The voltage of node D turns on the first NMOSFET MN1 to pull the voltage of node C to a logic low level L. Due to the weaker driving ability of the first NMOSFET MN1, the first NMOSFET MN1 pulls the voltage of node C to a logic low level L at time point t2 after time point t1. Simultaneously, the second inverter 221 pulls the voltage of node E to a logic high level H at time point t2 after time point t1. The falling-edge delay cell 222 pulls the voltage of the settle voltage SEL to a logic high level H at time point t2. During a period between time point t1 and time point t2, the multiplexer 223 selects and outputs the voltage of node D as the first digital voltage according to a logic low level L as the settle voltage SEL. The buffer 230 receives the voltage of node D to output a logic low level L as the output digital voltage O.

During a period between time point t2 and time point t3, the voltages of nodes C and D are respectively viewed as the first digital voltage and the second digital voltage. During a period between time point t2 and time point t3, the multiplexer 223 selects and outputs the voltage of node E according to a logic high level H as the settle voltage SEL. The buffer 230 receives the voltage of node E to output a logic low level H as the output digital voltage O.

When the level of the input digital voltage I descends from the logic high level H' to the logic low level L' at time point t3, the level of the input digital voltage IB rises from the logic low level L' to the logic high level H' at time point t3. The input digital voltage I turns off the first electrical switch 214. The input digital voltage IB turns on the second electrical switch 215. The current of the second current source 213 flows through the second electrical switch 215, so as to pull the voltage of node B to a low voltage. The voltage of node B turns on the first PMOSFET MP1 to pull the voltage of node C to a logic high level H. Simultaneously, the second inverter 221 pulls the voltage of node E to a logic low level L at time point t3. The voltage of node C turns on the second NMOSFET MN2 to pull the voltage of node D to a logic low level L. Due to the weaker driving ability of the second NMOSFET MN2, the second NMOSFET MN2 pulls the voltage of node D to a logic low level L at time point t4 after time point t3. The falling-edge delay cell 222 pulls the voltage of the settle voltage SEL to a logic low level L at time point t5 after time point t4. During a period between time point t3 and time point t5, the multiplexer 223 selects and outputs the voltage of node E according to a logic high level H as the settle voltage SEL. In other words, the level shifter 200 automatically selects a rapid signal-transmitting path without increasing quiescent current. The buffer 230 receives the voltage of node E to output a logic high level H as the output digital voltage O. After time point t5, the multiplexer 223 selects and outputs the voltage of node D according to a logic low level L as the settle voltage SEL. The buffer 230 receives the voltage of node D to output a logic low level L as the output digital voltage O.

Figure 7:
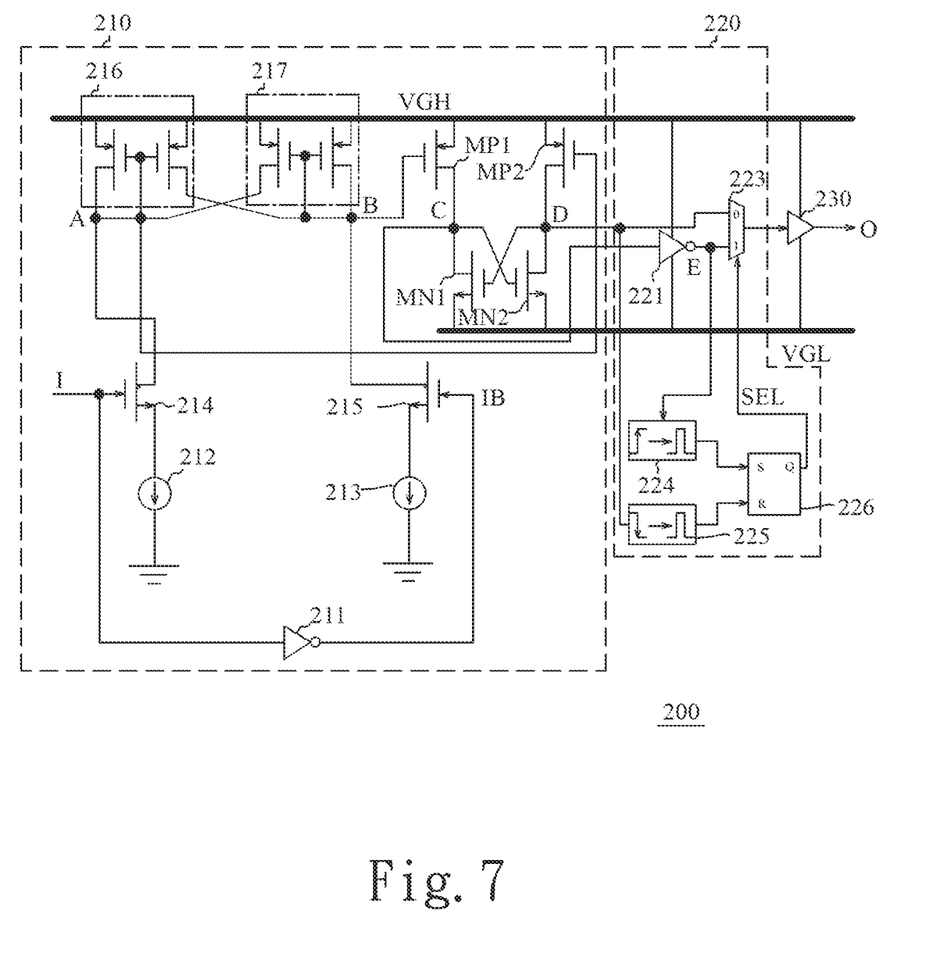
FIG. 7 is a diagram schematically illustrating a level shifter according to a third embodiment of the invention.
Figure 8:
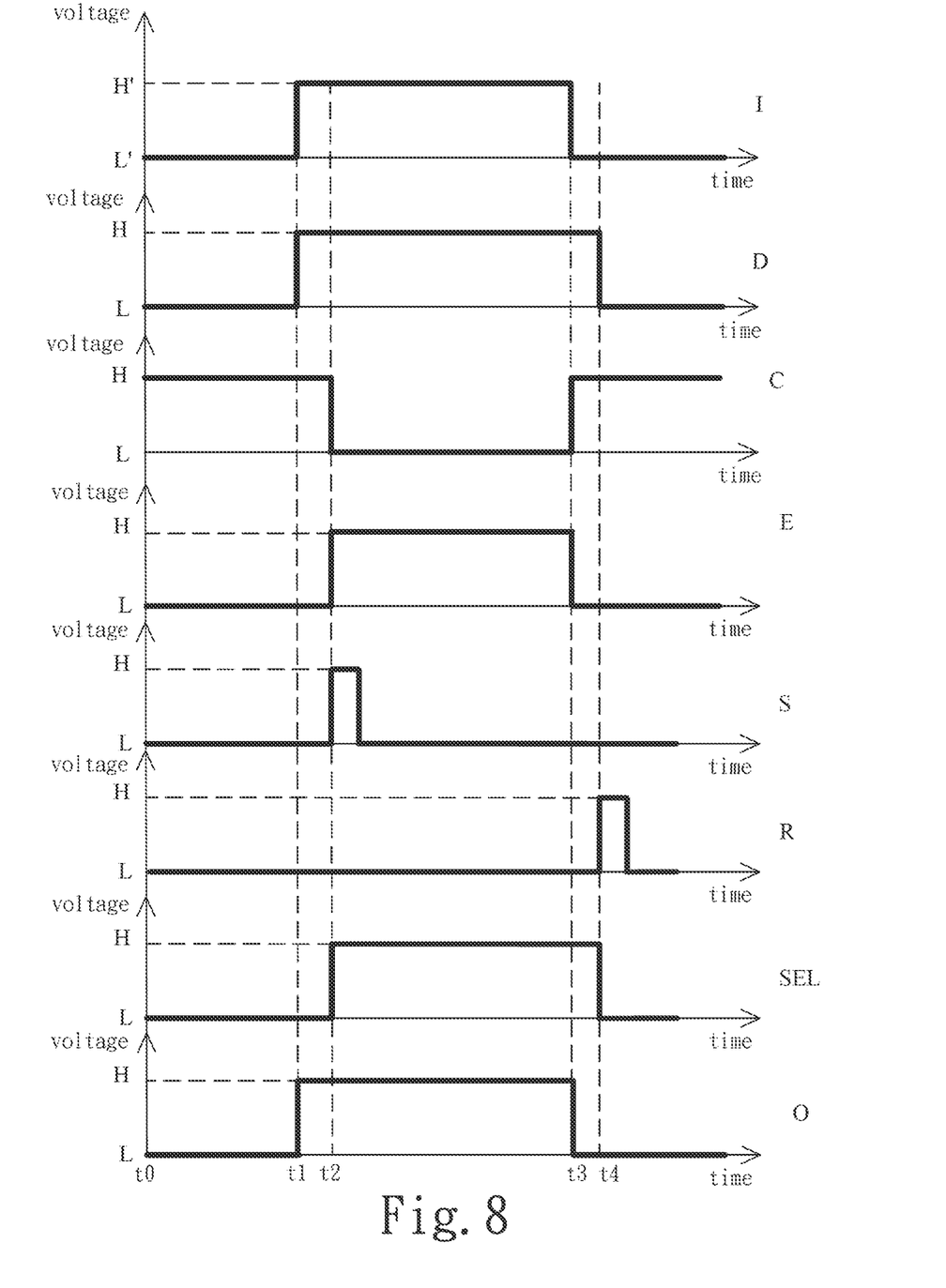
FIG. 8 is a diagram schematically illustrating the waveforms of an input digital voltage, signals of nodes, the input voltages of a SR latch, a settle voltage, and an output digital voltage of the level shifter according to the third embodiment of the invention.

FIG. 7 is a diagram schematically illustrating a level shifter according to a third embodiment of the invention. FIG. 8 is a diagram schematically illustrating the waveforms of an input digital voltage, signals of nodes, the input voltages of a SR latch, a settle voltage, and an output digital voltage of the level shifter according to the third embodiment of the invention. Referring to FIG. 7 and FIG. 8, the third embodiment of the invention is introduced as follows. The third embodiment is different from the second embodiment in the internal circuits of the selector 220. In the third embodiment, the selector 220 may include, but is not limited to, a second inverter 221, a multiplexer 223, a rising-edge pulse generator 224, a falling-edge pulse generator 225, and an SR latch 226. The input of the second inverter 221 is coupled to node C of the pre-level shifter 210. The rising-edge pulse generator 224 is coupled to the output of the second inverter 221. The output of the second inverter 221 is viewed as node E. The falling-edge pulse generator 225 is coupled to node D of the pre-level shifter 210. The S input and the R input of the SR latch 226 are respectively coupled to the rising-edge pulse generator 224 and the falling-edge pulse generator 225. The multiplexer 223 is coupled to the Q output of the SR latch 226, the output of the second inverter 221, and node D of the pre-level shifter.

The operation of the level shifter 200 of the third embodiment is introduced as follows. The operation of the pre-level shifter 210 has been described previously so it will not be reiterated. During a period between time point t0 and time point t1, the first electrical switch 214 and the first inverter 211 receive a logic low level L' as the input digital voltage I. The voltages of nodes C and D are respectively viewed as the second digital voltage and the first digital voltage. The second inverter 221 inverts the voltage of node C to generate a logic low level L at node E. The rising-edge pulse generator 224 receives the voltage of node E to generate a logic low level L received by the S input of the SR latch 226. The falling-edge pulse generator 225 receives the voltage of node D to generate a logic low level L received by the R input of the SR latch 226. Thus, the Q output of the SR latch 226 generates a logic low level L as a settle voltage SEL based on the voltages of the S input and the R input. The multiplexer 223 receives the voltages of nodes D and E and the settle voltage SEL. The multiplexer 223 selects and outputs the voltage of node D according to a logic low level L as the settle voltage SEL. Finally, the buffer 230 receives the voltage of node D to output a logic low level L as the output digital voltage O.

When the level of the input digital voltage I rises from the logic low level L' to the logic high level H' at time point t1, the level of the input digital voltage IB descends from the logic high level H' to the logic low level L' at time point t1. The second inverter 221 pulls the voltage of node E to a logic high level H at time point t2 after time point t1. The rising-edge pulse generator 224 receives the voltage of node E to generate a positive pulse received by the S input of the SR latch 226 at time point t2. The falling-edge pulse generator 225 receives the voltage of node D to generate a logic low level L received by the R input of the SR latch 226. Thus, the Q output of the SR latch 226 pulls the settle voltage SEL to a logic high level H based on the voltages of the S input and the R input at time point t2. During a period between time point t1 and time point t2, the multiplexer 223 selects and outputs the voltage of node D as the first digital voltage according to a logic low level L as the settle voltage SEL. Finally, the buffer 230 receives the voltage of node D to output a logic low level L as the output digital voltage O.

During a period between time point t2 and time point t3, the voltages of nodes C and D are respectively viewed as the first digital voltage and the second digital voltage. During a period between time point t2 and time point t3, the multiplexer 223 selects and outputs the voltage of node E according to a logic high level H as the settle voltage SEL. The buffer 230 receives the voltage of node E to output a logic low level H as the output digital voltage O.

When the level of the input digital voltage I descends from the logic high level H' to the logic low level L' at time point t3, the level of the input digital voltage IB rises from the logic low level L' to the logic high level H' at time point t3. The second inverter 221 pulls the voltage of node E to a logic low level L at time point t3. The rising-edge pulse generator 224 receives the voltage of node E to generate a logic low level L received by the S input of the SR latch 226. The falling-edge pulse generator 225 receives the voltage of node D to generate a positive pulse received by the R input of the SR latch 226 at time point t4. Thus, the Q output of the SR latch 226 pulls the settle voltage SEL to a logic low level L based on the voltages of the S input and the R input at time point t4 after time point t3. During a period between time point t3 and time point t4, the multiplexer 223 selects and outputs the voltage of node E according to a logic high level H as the settle voltage SEL. In other words, the level shifter 200 automatically selects a rapid signal-transmitting path without increasing quiescent current. Finally, the buffer 230 receives the voltage of node E to output a logic low level L as the output digital voltage O. After time point t4, the multiplexer 223 selects and outputs the voltage of node D according to a logic low level L as the settle voltage SEL. The buffer 230 receives the voltage of node D to output a logic low level L as the output digital voltage O.

According to the embodiments provided above, the level shifter automatically selects a fast signal-transmitting path in order to rapidly shift and output a voltage level without increasing quiescent current.

The embodiments described above are only to exemplify the invention and not to limit the scope of the invention. Therefore, any equivalent modification or variation according to the shapes, structures, features, or spirit disclosed by the invention is to be also included within the scope of the invention.

What is claimed is:

1. A level shifter comprising:
   a pre-level shifter configured to shift an input digital voltage to a first digital voltage and a second digital voltage, wherein a logic level of one of the first digital voltage and the second digital voltage transitions from a first logic state to a second logic state earlier in time than the other in response to a transition in a logic state of the input digital voltage; and
   a selector coupled to the pre-level shifter and configured to select and output the first digital voltage, wherein the logic level of the first digital voltage transitions from the first logic state to the second logic state earlier in time than the second digital voltage transitions from the first logic state to the second logic state;
   wherein the selector includes:
   an inverter with an input thereof coupled to the pre-level shifter;
   a falling-edge delay cell coupled to an output of the inverter; and
   a multiplexer coupled to the falling-edge delay cell, the output of the inverter, and the pre-level shifter.

2. The level shifter according to claim 1, further comprising a buffer coupled to the selector.

3. The level shifter according to claim 1, wherein the pre-level shifter includes:
   an inverter;
   a first current source and a second current source coupled to a first low-voltage terminal;
   a first electrical switch and a second electrical switch respectively coupled to the first current source and the second current source, wherein the second electrical switch is coupled to the inverter;
   a first current mirror and a second current mirror coupled to a high-voltage terminal and respectively coupled to the first electrical switch and the second electrical switch, wherein the first current mirror is coupled to the second current mirror;
   a first P-channel metal-oxide-semiconductor field effect transistor (PMOSFET) coupled to the high-voltage terminal, the second electrical switch, the second current minor, and the selector;
   a second P-channel metal-oxide-semiconductor field effect transistor (PMOSFET) coupled to the high-voltage terminal, the first electrical switch, the first current mirror, and the selector;
   a first N-channel metal-oxide-semiconductor field effect transistor (NMOSFET) coupled to a second low-voltage terminal, the first PMOSFET, the selector, and the second PMOSFET; and
   a second N-channel metal-oxide-semiconductor field effect transistor (NMOSFET) coupled to the second low-voltage terminal, the second PMOSFET, the selector, the first NMOSFET, and the first PMOSFET.

4. The level shifter according to claim 3, wherein the first current mirror includes two P-channel metal-oxide-semiconductor field effect transistors (PMOSFETs) and the second current mirror includes two P-channel metal-oxide-semiconductor field effect transistors (PMOSFETs).

5. The level shifter according to claim 3, wherein the first electrical switch and the second electrical switch are N-channel metal-oxide-semiconductor field effect transistors (NMOSFETs).

6. The level shifter according to claim 3, wherein a voltage of the first low-voltage terminal is substantially lower than a voltage of the second low-voltage terminal.

7. A level shifter comprising:
   a pre-level shifter configured to shift an input digital voltage to a first digital voltage and a second digital voltage, wherein a logic level of one of the first digital voltage and the second digital voltage transitions from a first logic state to a second logic state earlier in time than the other in response to a transition in a logic state of the input digital voltage; and a selector coupled to the pre-level shifter and configured to select and output the first digital voltage, wherein the logic level of the first digital voltage transitions from the first logic state to the second logic state earlier in time than the second digital voltage transitions from the first logic state to the second logic state;

wherein the selector includes:

an inverter with an input thereof coupled to the pre-level shifter;

a rising-edge pulse generator coupled to an output of the inverter;

a falling-edge pulse generator coupled to the pre-level shifter;

an SR latch coupled to the rising-edge pulse generator and the falling-edge pulse generator; and a multiplexer coupled to the SR latch, the output of the inverter, and the pre-level shifter.

\* \* \* \* \*